US 9,209,849 B2

(12) United States Patent
Kim et al.

(10) Patent No.: US 9,209,849 B2
(45) Date of Patent: Dec. 8, 2015

(54) APPARATUS FOR ENHANCING EFFICIENCY OF ANTENNA IN A MOBILE TERMINAL

(75) Inventors: Jin-Man Kim, Gyeongsangbuk-do (KR); Chang-Ha Kim, Gyeongsangbuk-do (KR); Byung-Kyu Kim, Gyeongsangbuk-do (KR); Jun-Hui Lee, Gyeongsangbuk-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 1258 days.

(21) Appl. No.: 12/878,230

(22) Filed: Sep. 9, 2010

(65) Prior Publication Data

US 2011/0065429 A1 Mar. 17, 2011

(30) Foreign Application Priority Data

Sep. 11, 2009 (KR) .................. 10-2009-0085938

(51) Int. Cl.
| | |
|---|---|
| *H01Q 11/12* | (2006.01) |
| *H04B 1/04* | (2006.01) |
| *H04B 1/18* | (2006.01) |
| *H01Q 1/24* | (2006.01) |
| *H03H 7/40* | (2006.01) |

(52) U.S. Cl.
CPC ................. *H04B 1/18* (2013.01); *H01Q 1/242* (2013.01); *H04B 1/0458* (2013.01); *H03H 7/40* (2013.01)

(58) Field of Classification Search
CPC ......... H01Q 1/242; H01Q 1/245; H03H 7/40; H04B 1/0458; H04B 1/18; H04B 7/0608; H04B 7/0814
USPC .................. 455/120, 121, 123, 124, 125, 126
See application file for complete search history.

(56) References Cited

U.S. PATENT DOCUMENTS

| 6,275,714 B1* | 8/2001 | Kintz et al. .................... 455/566 |
| 2002/0094789 A1* | 7/2002 | Harano ............................ 455/90 |
| 2004/0100341 A1* | 5/2004 | Luetzelschwab et al. ....... 333/32 |
| 2004/0152497 A1* | 8/2004 | Odachi et al. .............. 455/575.1 |
| 2004/0192406 A1* | 9/2004 | Okazaki et al. ............. 455/575.7 |

(Continued)

FOREIGN PATENT DOCUMENTS

| JP | 6-41245 U | 5/1994 |
| JP | 2001-217624 A | 8/2001 |

(Continued)

*Primary Examiner* — Duc M Nguyen
(74) *Attorney, Agent, or Firm* — Cha & Reiter, LLC

(57) ABSTRACT

An apparatus for enhancing an efficiency of an antenna in a mobile terminal includes an antenna matcher whose setting is changed under control of a controller, the antenna matcher coupled to the antenna, a sensing unit for sensing whether or not a user holds the mobile terminal and a holding pattern in which the user holds the mobile terminal, and a controller for controlling the setting of the antenna matcher according to whether or not the user holds the mobile terminal and the holding pattern.

19 Claims, 6 Drawing Sheets

(56) References Cited

U.S. PATENT DOCUMENTS

| | | |
|---|---|---|
| 2005/0239519 A1* | 10/2005 | Saitou et al. ............... 455/575.1 |
| 2006/0084395 A1* | 4/2006 | Kezys et al. ................. 455/101 |
| 2007/0002016 A1* | 1/2007 | Cho et al. ...................... 345/157 |
| 2007/0194859 A1* | 8/2007 | Brobston et al. ............. 333/17.3 |
| 2007/0216584 A1* | 9/2007 | Nishikido et al. ............ 343/702 |
| 2008/0136729 A1 | 6/2008 | Kang et al. |
| 2008/0207285 A1* | 8/2008 | Kezys et al. ............... 455/575.7 |
| 2010/0097331 A1* | 4/2010 | Wu ................................ 345/173 |
| 2010/0134423 A1* | 6/2010 | Brisebois et al. ............ 345/173 |
| 2010/0220066 A1* | 9/2010 | Murphy ........................ 345/173 |
| 2010/0317332 A1* | 12/2010 | Bathiche et al. ............. 455/418 |
| 2011/0010875 A1* | 1/2011 | Iwahori et al. ................. 15/22.1 |
| 2011/0014886 A1* | 1/2011 | Manssen et al. .............. 455/121 |

FOREIGN PATENT DOCUMENTS

| | | | |
|---|---|---|---|
| KR | 1997-77359 | 12/1997 | ............... H04N 9/29 |
| KR | 2002-46366 | 8/2002 | ............. G01C 21/20 |
| KR | 10-0763994 B1 | 10/2007 | |

* cited by examiner

APPARATUS FOR ENHANCING EFFICIENCY OF ANTENNA IN A MOBILE TERMINAL

CLAIM OF PRIORITY

This application claims the benefit under 35 U.S.C. §119 (a) of a Korean Patent Application filed in the Korean Intellectual Property Office on Sep. 11, 2009 and assigned Serial No. 10-2009-0085938, the entire disclosure of which is hereby incorporated by reference.

BACKGROUND OF THE INVENTION

1. Field of the Invention

The present invention relates generally to an antenna, and more particularly, to an apparatus for enhancing the efficiency of an antenna in a mobile terminal.

2. Description of the Related Art

Generally, a mobile terminal refers to a communication apparatus carried with a user to perform communication or exchange data. With the arrival of the era of digital convergence, various other functions have been implemented in a mobile terminal.

In spite of diversification of functions implemented in a mobile terminal, securing an adequate signal wave reception is vital in the mobile terminal.

The efficiency of an antenna of a mobile terminal is generally controlled and adjusted in an antenna chamber. However, the antenna efficiency is degraded because such adjustment ignores antenna's impedance mismatch caused by a user's holding of the mobile terminal. In other words, as the user holds the mobile terminal, the static characteristics of the mobile terminal are changed, thus degrading the antenna efficiency of the mobile terminal. Moreover, the static characteristics of the mobile terminal are changed differently according to a holding pattern such as whether the user holds the mobile terminal by the left hand or the right hand.

To sum up, in case of the conventional mobile terminal, the impedance of the antenna is previously set regardless of whether the user hold or not hold the mobile terminal during operation. As a result, the antenna efficiency is inevitably degraded when the user holds the mobile terminal and interferes with an impedance matching of the antenna.

SUMMARY OF THE INVENTION

An aspect of the present invention is to address at least the above problems and/or disadvantages and to provide at least the advantages described below. Accordingly, an aspect of the present invention is to solve antenna efficiency degradation caused by the user's holding of a mobile terminal.

According to an aspect of the present invention, an apparatus for enhancing an efficiency of an antenna in a mobile terminal includes an antenna matcher whose setting is changed under control of a controller, the antenna matcher coupled to the antenna, a sensing unit for sensing whether or not a user holds the mobile terminal and for sensing a holding pattern in which the user holds the mobile terminal, and a controller for controlling the setting of the antenna matcher according to whether or not the user holds the mobile terminal and the holding pattern.

BRIEF DESCRIPTION OF THE DRAWINGS

The above and other features and advantages of an exemplary embodiment of the present invention will be more apparent to those skilled in the art from the following detailed description taken in conjunction with the accompanying drawings, in which.

DETAILED DESCRIPTION OF THE INVENTION

Hereinafter, an exemplary embodiment of the present invention will be described in detail with reference to the accompanying drawings.

Figure 1:
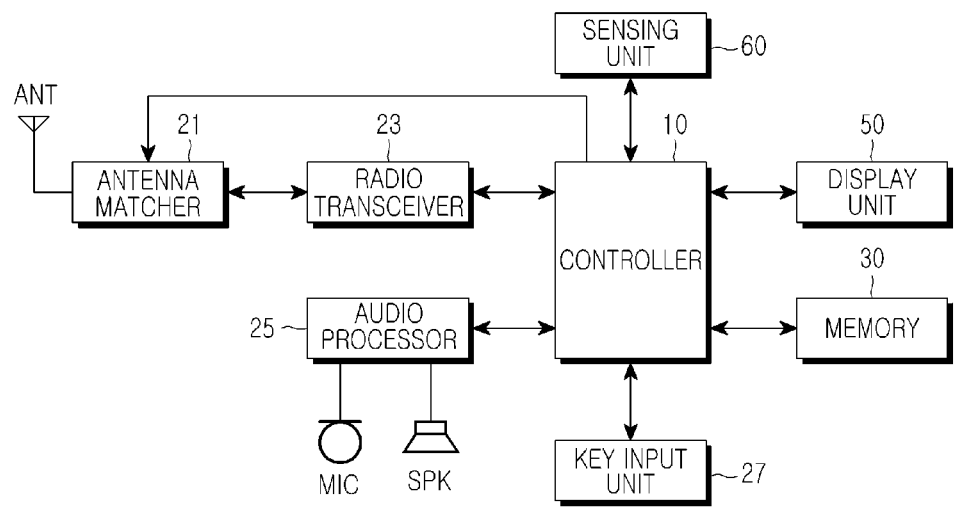
FIG. 1 is a block diagram of a mobile terminal according to an embodiment of the present invention.

FIG. 1 is a block diagram of a mobile terminal according to an embodiment of the present invention.

Referring to FIG. 1, an antenna matcher 21 is connected with an antenna ANT and its capacitance or inductance is selectively changed under control of a controller 10. In operation, the antenna matcher 21 according to an embodiment of the present invention allows impedance matching of the antenna ANT when the impedance mismatch of the antenna ANT occurs due to user's holding of the mobile terminal.

A radio transceiver 23 performs a radio communication function of the mobile terminal and includes a Radio Frequency (RF) unit and a modulator/demodulator (MODEM). The RF unit includes an RF transmitter for up-converting a frequency of a transmission signal and amplifying the transmission signal and an RF receiver for low-noise amplification of a received signal and down-converting a frequency of the received signal. The MODEM includes a transmitter for encoding and modulating a transmission signal, and a receiver for demodulating and decoding a signal received from the RF unit.

An audio processor unit 25 may be a COder/DECoder (CODEC). The codec includes a data codec for processing packet data, and an audio codec for processing an audio signal such as voice or a multimedia file. The audio processor unit 25 receives a digital audio signal from the MODEM, converts the received digital audio signal into an analog audio signal through the audio codec, and reproduces the analog audio signal. Alternatively, the audio processor unit 25 receives an analog audio signal generated from a microphone MIC, converts the received analog audio signal into a digital audio signal through the audio codec, and transmits the digital audio signal to the MODEM. The codec may be provided separately or included in the controller 10 of the mobile terminal. The audio processor 25 according to an embodiment of the present invention may output a sensing result indicative of whether or not the user holds the mobile terminal and its related pattern of the holding in the form of auditory information if a sensing unit 60 senses whether or not the user holds the mobile terminal.

A key input unit 27 includes input keys for inputting numeral and character information, and function keys for setting various functions.

A memory 30 includes a Read Only Memory (ROM) and a Random Access Memory (RAM). The memory 30 may include program and data memories, and may store programs for controlling operations of the mobile terminal and booting data. The memory 30 according to an embodiment of the present invention may store a matching table in which a setting value of the antenna matcher 21 is matched to each pattern of user's holding of the mobile terminal, or each holding pattern, such as left-hand holding or right-hand holding.

A display unit 50 displays an image signal and user data on the screen or displays data related to communication. The display unit 50 may employ a Liquid Crystal Display (LCD), an Organic Light Emitting Diode (OLED), an Active Matrix Organic Light Emitting Diode (AM OLED), or the like. When the LCD, the OLED, or the AM OLED is embodied in a touch screen display, the display unit 50 may operate as an input unit for controlling the mobile terminal, in conjunction with the key input unit 27. Thus, the display unit 50 according to an embodiment of the present invention includes a touch screen to operate as an input unit for controlling the mobile terminal, together with the key input unit 27. In addition, the display unit 50 according to an embodiment of the present invention may output a sensing result (for example, whether or not the user holds the mobile terminal and the user's holding pattern) to the user in the form of visual information if the sensing unit 60 senses whether or not the user holds the mobile terminal.

The sensing unit 60 includes one of an earth magnetic field sensor or a touch sensor to sense whether or not the user holds the mobile terminal and by which hand the user holds the mobile terminal. It is assumed that the touch sensor according to an embodiment of the present invention may be a capacitive overlay touch sensor, which senses whether or not the user holds the mobile terminal by sensing a change in the static characteristics of the mobile terminal. Further, the sensing unit 60 according to an embodiment of the present invention may include both an earth magnetic field sensor and a touch sensor to sense whether or not the user holds the mobile terminal and by which hand the user holds the mobile terminal with an inclination of the mobile terminal through the earth magnetic field sensor. Moreover, the sensing unit 60 according to an embodiment of the present invention may include only the earth magnetic field sensor to sense the inclination of the mobile terminal, thereby simultaneously sensing whether or not the user holds the mobile terminal as well as the holding pattern (left-hand holding or right-hand holding) according to the direction of the inclination.

When the display unit 50 is embodied as a touch screen according to a modification of an embodiment of the present invention, the touch sensor of the sensing unit 60 may be replaced with the touch screen of the display unit 50. As such, when the user holds a portion of the touch screen, the sensing unit 60 may sense that the user holds the mobile terminal.

The controller 10 controls the overall operation of the mobile terminal. Once the sensing unit 60 senses whether or not the user holds the mobile terminal and the user's holding pattern, the controller 10 according to an embodiment of the present invention controls the antenna matcher 21 according to a sensing result, thereby preventing antenna efficiency degradation caused by the user's holding of the mobile terminal.

FIGS. 2A through 3B are diagrams illustrating various examples of the antenna matcher 21 according to an embodiment of the present invention.

Figure 2A:
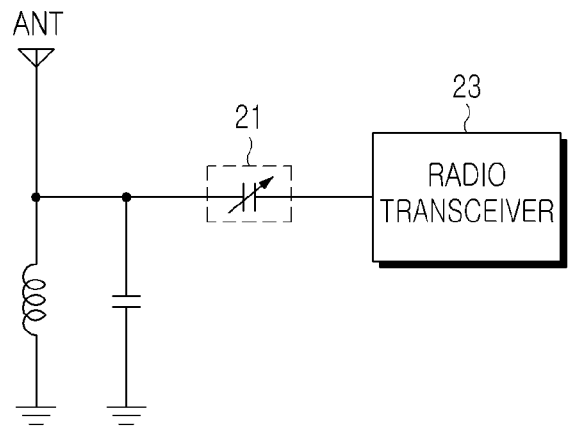
FIGS. 2A through 3B are diagrams illustrating various examples of an antenna matcher according to an embodiment of the present invention.

FIG. 2A illustrates an example where the antenna matcher 21 according to an embodiment of the present invention is implemented with a trimmer capacitor. In FIG. 2A, a capacitance of the trimmer capacitor is changed by a control signal (not shown) of the controller 10. The antenna matcher 21 enables the impedance of the antenna mismatched by the user's holding of the mobile terminal to be matched again by changing the capacitance.

Figure 2B:
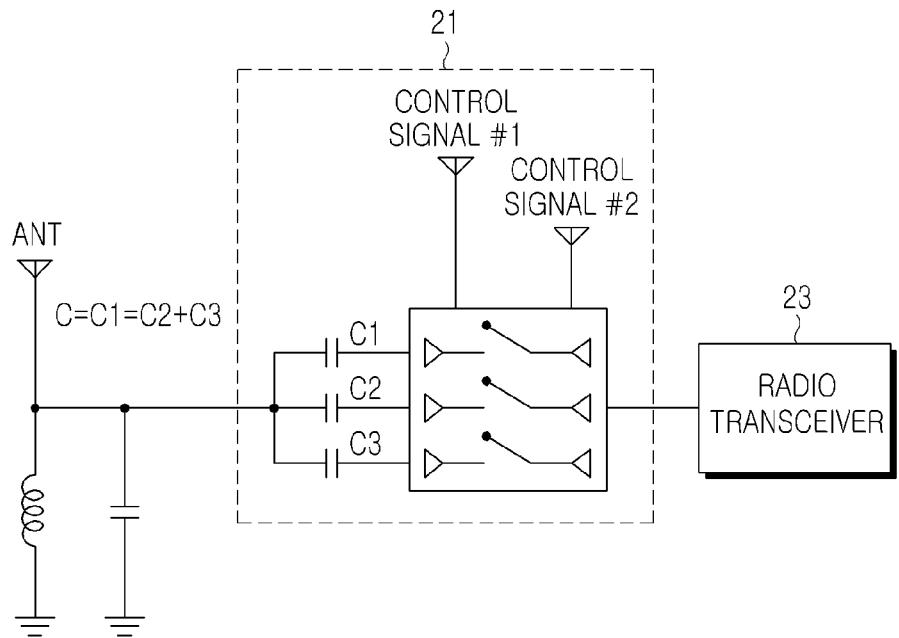

FIG. 2B illustrates an example where the antenna matcher 21 according to an embodiment of the present invention is implemented with one or more capacitors (for example, C1, C2, and C3) and one or more switching elements. In FIG. 2B, the switching elements short-circuit or connect the capacitors according to control signals #1 and #2 of the controller 10, thereby changing a capacitance C of the antenna matcher 21. In this way, the antenna matcher 21 enables the impedance of the antenna mismatched by the user's holding of the mobile terminal to be matched again by changing the capacitance C.

Figure 3A:
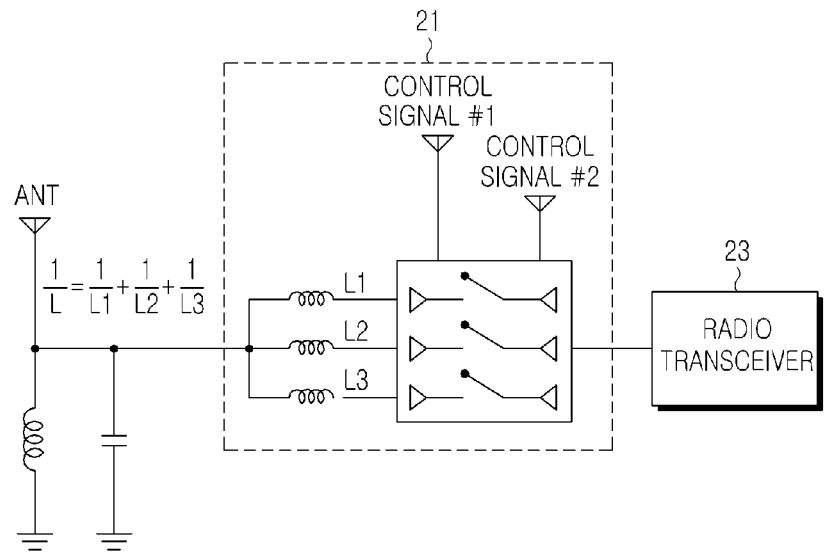

FIG. 3A illustrates an example where the antenna matcher 21 according to an embodiment of the present invention is implemented with one or more inductors (for example, L1, L2, and L3) and one or more switching elements. In FIG. 3A, the switching elements short-circuit or connect the inductors according to control signals #1 and #2 of the controller 10, thereby changing an inductance L of the antenna matcher 21. Consequently, the antenna matcher 21 enables the impedance of the antenna mismatched by the user's holding of the mobile terminal to be matched again by changing the inductance L.

Figure 3B:
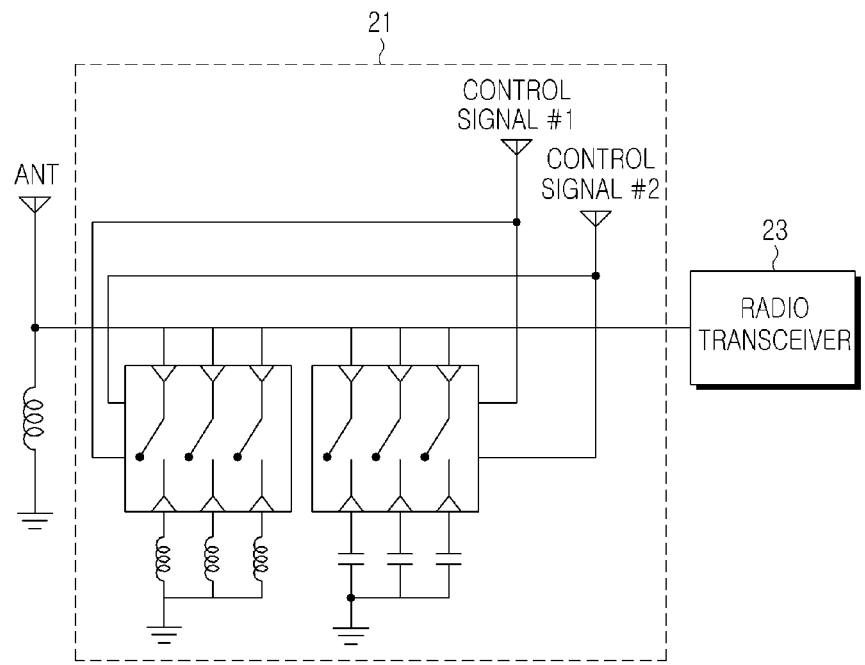

FIG. 3B illustrates an example where the antenna matcher 21 according to an embodiment of the present invention is implemented with one or more capacitors (for example, C1, C2, and C3), one or more inductors (for example, L1, L2, and L3), and one or more switching elements. In FIG. 3B, the switching elements short-circuit or connect the capacitors and the inductors according to control signals #1 and #2 of the controller 10, thereby changing the capacitance and the inductance of the antenna matcher 21. Hence, the antenna matcher 21 enables the impedance of the antenna mismatched by the user's holding of the mobile terminal to be matched again by changing the capacitance and the inductance.

Figure 4:
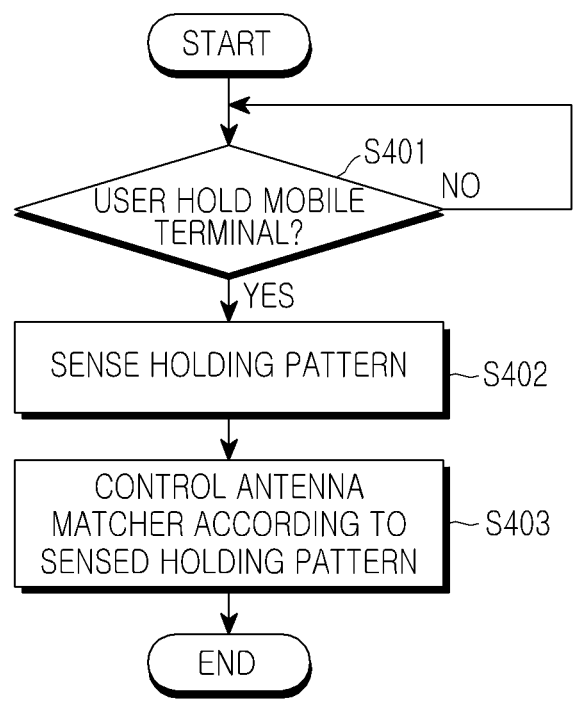
FIG. 4 is a flowchart illustrating a process of compensating for antenna efficiency degradation caused by the user's holding of a mobile terminal according to an embodiment of the present invention.
Figure 5A:
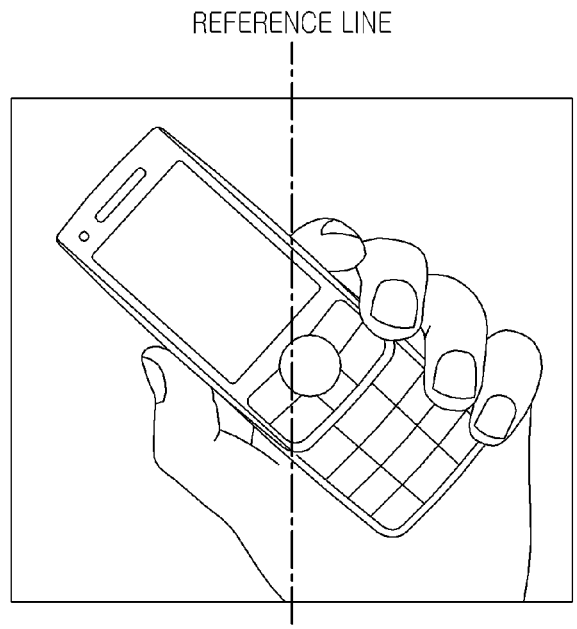
FIGS. 5A through 6 are diagrams illustrating an example of FIG. 4.
Figure 5B:
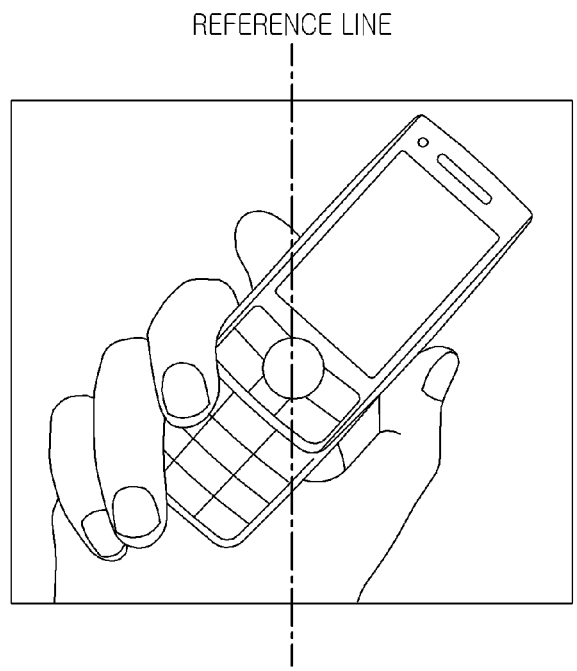
Figure 6:
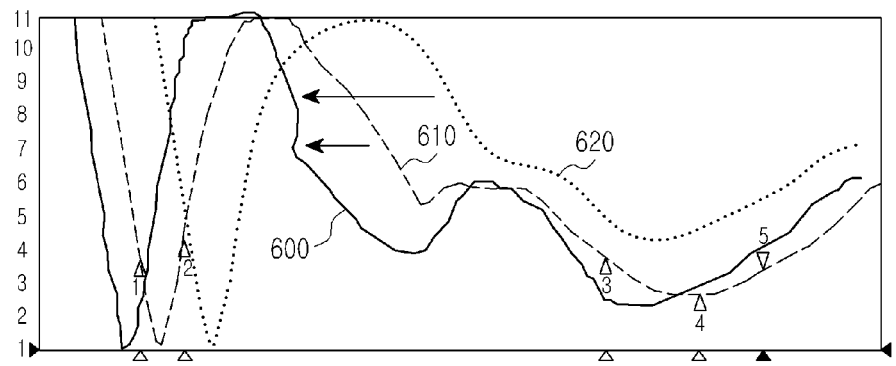
Figure 6:
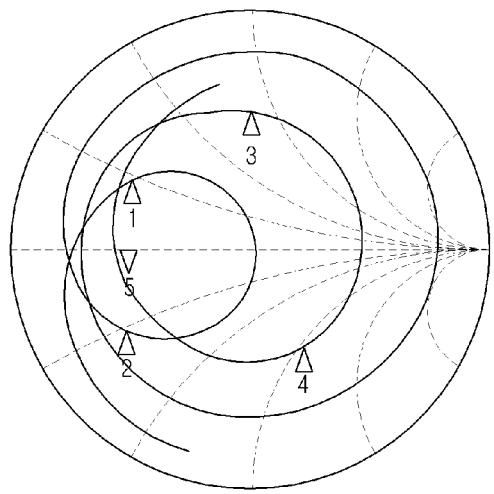

FIG. 4 is a flowchart illustrating a process of compensating for antenna efficiency degradation caused by the user's holding of the mobile terminal according to an embodiment of the present invention, and FIGS. 5A through 6 are diagrams illustrating an example of FIG. 4. With reference to FIGS. 1 through 6, a description will be made of an embodiment of the present invention.

Referring to FIG. 4, the controller 10 controls the sensing unit 60 to sense whether the user holds the mobile terminal in step S401, and to sense a pattern of the sensed user's holding of the mobile terminal (left-hand holding or right-hand holding) in step S402.

As shown in FIGS. 5A and 5B, the user, when holding the mobile terminal to use it, holds the mobile terminal by the left hand or the right hand. Since the user directs the microphone to the mouth and the speaker to the ear to perform communication by using the mobile terminal, the mobile terminal is inclined as shown in FIG. 5A or FIG. 5B. When the user performs communication while holding the mobile terminal by the left hand, the mobile terminal is inclined to the left with respect to a reference line as shown in FIG. 5A. When the user holds the mobile terminal by the right hand for communication, the mobile terminal is inclined to the right with respect to the reference line as shown in FIG. 5B.

Accordingly, the sensing unit 60 according to an embodiment of the present invention senses whether or not the user holds the mobile terminal by sensing a change in static characteristics caused by the user's holding of the mobile terminal, and senses by which one of the left hand and the right hand the user holds the mobile terminal by sensing a direction the mobile terminal is inclined through an earth magnetic field sensor. Sensing a direction of the mobile terminal is known in the art that can be performed in a variety of ways. See for example, KR 10-1997-0077359 and KR 10-2002-0046366.

Once the controller 10 recognizes (or senses) whether the user holds the mobile terminal and the user's holding pattern through steps S401 and S402, the controller 10 controls the antenna matcher 21 according to the recognized holding pattern in step S403.

Since the antenna has various pattern structures according to a type of the mobile terminal, the influence of the user's holding upon the impedance mismatch of the antenna also varies according to whether the user holds the mobile terminal by the left hand or the right hand. The memory 30 according to an embodiment of the present invention stores setting values of the antenna matcher 21 for a case where the user does not hold the mobile terminal (free space situation), a case where the user holds the mobile terminal by the left hand, and a case where the user holds the mobile terminal by the right hand. Although it is assumed that the setting values of the antenna matcher 21 stored in the memory 30 are applied differently according to a type of the mobile terminal by a manufacturer, the user may also change the setting values of the antenna matcher 21 according to a modification of an embodiment of the present invention.

Thus, the controller 10 according to an embodiment of the present invention controls the antenna matcher 21 to change setting of the antenna matcher 21 according to a user's holding pattern by referring to the setting values of the antenna matcher 21 stored in the memory 30. For example, in case of the antenna matcher 21 implemented as shown in FIG. 2A, the controller 10 changes the capacitance of the trimmer capacitor according to the holding pattern by referring to the setting values of the antenna matcher 21. For the antenna matcher 21 implemented as shown in FIG. 2B, the controller 10 controls the switching elements to change the capacitance of the antenna matcher 21 according to the holding pattern by referring to the setting values of the antenna matcher 21. When the antenna matcher 21 is implemented as shown in FIG. 3A, the controller 10 controls the switching elements to change the inductance of the antenna matcher 21 according to the holding pattern by referring to the setting values of the antenna matcher 21. If the antenna matcher 21 is implemented as shown in FIG. 3B, the controller 10 controls the switching elements to change the inductance and the capacitance of the antenna matcher 21 according to the holding pattern by referring to the setting values of the antenna matcher 21.

Once the controller 10 changes setting of the antenna matcher 21 according to the holding pattern by referring to the setting values of the antenna matcher 21 stored in the memory 30, the impedance of the antenna mismatched by the user's holding of the mobile terminal is matched again.

The above-described methods according to the present invention can be realized in hardware or as software or computer code that can be stored in a machine readable recording medium such as a CD ROM, a RAM, thumbnail drive, a floppy disk, a flash storage, a hard disk, or a magneto-optical disk or downloaded over a network and stored as a non-transitory data on one of the aforementioned mediums, so that the methods described herein can be executed by such software using a general purpose computer, or a special processor or in programmable or dedicated hardware, such as an ASIC or FPGA. As would be understood in the art, the computer, the processor or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

For example, FIG. 6 shows an example where a Standing-Wave Ratio (SWR) of the antenna is measured by an N/W analyzer, especially, characteristics at start points 1-5 (980 MHz, 960 MHz, 1.71 GHz, 1.88 GHz, and 1.99 GHz) of a use frequency band. As shown in FIG. 6, when the setting of the antenna matcher 21 is changed according to whether or not the user holds the mobile terminal and the holding pattern, the mismatched impedance of the antenna is matched again, thus changing the characteristics of the antenna.

For example, when the characteristics of the antenna, e.g., impedance match, as indicated by 600 are changed into those indicated by 610, e.g., impedance mismatch, due to the left-hand holding, or those indicated by 620, e.g., impedance mismatch, due to the right-hand holding, the changed characteristics may be changed again to be similar to the characteristics indicated by 600 by changing the setting of the antenna matcher 21. Hence, the user can use the mobile terminal without antenna efficiency degradation, even while holding the mobile terminal.

As is apparent from the foregoing description, the present invention can prevent the efficiency of the antenna of the mobile terminal from being degraded when the user holds the mobile terminal.

Although an embodiment of the present invention has been described for illustrative purposes rather than limiting purposes, those skilled in the art will appreciate that changes in components that can be substituted equivalently in the present invention also fall within the scope of the present invention, without departing from the scope and spirit of the invention as disclosed in the accompanying claims.

What is claimed is:

1. An apparatus for enhancing an efficiency of an antenna in a mobile terminal, the apparatus comprising:
    an antenna matcher coupled to the antenna;
    a sensing unit comprising a touch sensor for sensing whether or not a user holds the mobile terminal, and at least one inclination sensor for sensing inclination of the mobile terminal, the inclination corresponding to a holding pattern of the user; and
    a controller for determining the user's holding pattern based on the sensed inclination, and for controlling the setting of the antenna matcher according to whether or not the user holds the mobile terminal and the user's holding pattern.

2. The apparatus of claim 1, wherein the inclination sensor is an earth magnetic field sensor.

3. The apparatus of claim 2, wherein the holding pattern is classified into left-hand holding or right-hand holding according to the earth magnetic field sensor of the sensing unit.

4. The apparatus of claim 1, wherein the antenna matcher comprises a trimmer capacitor whose capacitance is changed according to a control signal of the controller.

5. The apparatus of claim 1, wherein the antenna matcher comprises one or more capacitors and one or more switching elements, and the one or more switching elements short-circuit or connect the one or more capacitors, wherein impedance of the antenna mismatched by the user's holding of the mobile terminal is matched again by changing the capacitance of the antenna matcher according to a control signal of the controller.

6. The apparatus of claim 1, wherein the antenna matcher comprises one or more inductors and one or more switching elements, and the one or more switching elements short-circuit or connect the one or more inductors impedance of the antenna mismatched by the user's holding of the mobile terminal is matched again by changing the inductance of the antenna matcher according to a control signal of the controller.

7. The apparatus of claim 1, wherein the antenna matcher comprises one or more capacitors, one or more inductors, and one or more switching elements, and the one or more switching elements short-circuit or connect at least one of the one or more capacitors and the one or more inductors impedance of the antenna mismatched by the user's holding of the mobile terminal is matched again by changing the capacitance and inductance of the antenna matcher according to a control signal of the controller.

8. The apparatus of claim 1, wherein the controller controls settings of the antenna matcher according to a user's holding pattern by referring to setting values stored in a memory.

9. The apparatus of claim 1, wherein the touch sensor is a capacitive overlay touch sensor.

10. A mobile terminal, comprising:
   a sensor unit comprising a touch sensor for sensing whether or not a user holds the mobile terminal, and at least one inclination sensor for sensing inclination of the mobile terminal, the sensed inclination corresponding to a user's holding pattern;
   a memory for storing a predetermined setting value corresponding to at least one user's holding pattern;
   an antenna matcher coupled to an antenna to adjust an impedance match of the antenna; and
   a controller for determining the user's holding pattern based on the sensed inclination, and for controlling the setting of the antenna matcher according to whether or not the user holds the mobile terminal and the user's holding pattern by referring to the setting values stored in the memory in order to match an impedance of the antenna during holding of the mobile terminal.

11. A method for enhancing an efficiency of an antenna in a mobile terminal, comprising:
   sensing whether a user holds the mobile terminal via a touch sensor;
   sensing a corresponding inclination via an inclination sensor;
   determining a holding pattern of the user based on the sensed inclination;
   retrieving a predetermined setting value corresponding to the determined holding pattern and the sensing that the user holds the mobile terminal; and
   adjusting an impedance match of the antenna based on the retrieved setting value.

12. The method of claim 11, further comprising storing the predetermined setting value in a memory.

13. The method of claim 11, wherein the holding pattern is classified into left-hand holding or right-hand holding.

14. A mobile terminal, comprising:
   an antenna matcher coupled to an antenna;
   a touch screen configured to display data related to communication and to sense a user's touch thereon, wherein the touch screen is disposed on a front side of the mobile terminal; and
   a controller, coupled to the touch screen, configured to determine whether or not the user holds the mobile terminal based on information sensed by the touch screen, configured to determine based on the position of the user's touch on the touch screen by which hand the user holds the mobile terminal, and configured to control the setting of the antenna matcher according to by which hand the user holds the mobile terminal.

15. The mobile terminal of claim 14, wherein the antenna matcher comprises one or more capacitors or inductors and one or more switching elements, and the one or more switching elements short-circuit or connect the one or more capacitors or inductors, wherein impedance of the antenna mismatched by the user's holding of the mobile terminal is matched again by changing the capacitance or inductance of the antenna matcher according to a control signal of the controller.

16. The mobile terminal of claim 14, further comprising a memory that stores setting values for the antenna matcher, and wherein the controller controls the settings of the antenna matcher according to a user's holding pattern by referring to the setting values stored in the memory.

17. A method for enhancing an efficiency of an antenna in a mobile terminal having a touch screen, comprising:
   receiving a call in the mobile terminal;
   in response to the receiving of the call, sensing a user's touch on the touch screen by the touch screen, wherein the touch screen is disposed on a front side of the mobile terminal and is for displaying data related to communication; and
   determining whether or not the user holds the mobile terminal based on information sensed by the touch screen, and determining based on the position of the user's touch on the touch screen, by which hand the user holds the mobile terminal; and
   controlling an impedance match of the antenna based on by which hand the user holds the mobile terminal.

18. The method of claim 17, wherein the impedance match of the antenna is set through an antenna matcher, and further comprising:
   storing setting values for the antenna matcher in a memory;
   controlling settings of the antenna matcher to thereby adjust the impedance match, according to a user's holding pattern, by referring to the setting values stored in the memory.

19. The method of claim 18, wherein the antenna matcher comprises one or more capacitors or inductors and one or more switching elements, and the one or more switching elements short-circuit or connect the one or more capacitors or inductors, wherein impedance of the antenna mismatched by the user's holding of the mobile terminal is matched again by changing the capacitance or inductance of the antenna matcher according to a control signal of the controller.

* * * * *